(12) United States Patent
Sarraf et al.

(10) Patent No.: US 12,016,137 B2
(45) Date of Patent: Jun. 18, 2024

(54) ELECTRONIC COMPONENT WITH COOLING CLEARANCE, AND ASSEMBLY METHOD

(71) Applicants: TE Connectivity Germany GmbH, Bensheim (DE); TE Connectivity Services GmbH, Schaffhausen (CH)

(72) Inventors: David Bruce Sarraf, Middletown, PA (US); Bernd Kosch, Bensheim (DE); Andreas Hangauer, Bensheim (DE)

(73) Assignees: TE Connectivity Germany GmbH, Bensheim (DE); TE Connectivity Solutions GmbH, Schaffhausen (CH)

( * ) Notice: Subject to any disclaimer, the term of this patent is extended or adjusted under 35 U.S.C. 154(b) by 20 days.

(21) Appl. No.: 17/372,996

(22) Filed: Jul. 12, 2021

(65) Prior Publication Data
US 2022/0022328 A1 Jan. 20, 2022

(30) Foreign Application Priority Data

Jul. 16, 2020 (EP) ..................................... 20186153

(51) Int. Cl.
*H05K 5/00* (2006.01)
*H05K 5/02* (2006.01)

(52) U.S. Cl.
CPC ......... *H05K 5/0026* (2013.01); *H05K 5/0213* (2013.01)

(58) Field of Classification Search
CPC ............................ H05K 5/0213; H05K 5/0026
See application file for complete search history.

(56) References Cited

U.S. PATENT DOCUMENTS

| 4,843,520 A * | 6/1989 | Nakatani | H05K 1/189 |
| | | | 361/730 |
| 5,218,516 A * | 6/1993 | Collins | H05K 7/20545 |
| | | | 361/721 |
| 6,449,159 B1 | 9/2002 | Haba | |
| 7,446,410 B2 * | 11/2008 | Wehrly, Jr. | H05K 1/189 |
| | | | 257/730 |
| 9,729,076 B2 * | 8/2017 | Nakatsu | H05K 7/20927 |
| 10,348,214 B2 * | 7/2019 | Nakatsu | B60L 50/64 |

(Continued)

FOREIGN PATENT DOCUMENTS

| DE | 2621705 A1 | 12/1977 | |
| FR | 2722054 A1 * | 1/1996 | ......... H05K 7/20145 |
| FR | 2722054 A1 | 1/1996 | |

OTHER PUBLICATIONS

Translation of FR 2722054 A1 (Year: 1996).*

(Continued)

*Primary Examiner* — Abhishek M Rathod
(74) *Attorney, Agent, or Firm* — Barley Snyder

(57) ABSTRACT

An electronic component includes a circuit carrier unit and a housing at least partly encompassing the circuit carrier unit. The circuit carrier unit has an electronic element assembled on the circuit carrier unit. The circuit carrier unit has a first section and a second section arranged at a distance from the first section and opposing the first section. The housing has a first receiving portion receiving the first section and a second receiving portion receiving the second section. The first receiving portion and the second receiving portion are separated from each other by a cooling clearance.

19 Claims, 2 Drawing Sheets

(56) References Cited

U.S. PATENT DOCUMENTS

| | | | | |
|---|---|---|---|---|
| 11,139,748 B2* | 10/2021 | Nakatsu | .................. | B60L 50/64 |
| 2016/0308456 A1* | 10/2016 | Nakatsu | ................ | H01L 23/473 |
| 2020/0245480 A1* | 7/2020 | Mauger | ................ | H05K 5/0056 |
| 2022/0312632 A1* | 9/2022 | Linares | .............. | H05K 7/20145 |

OTHER PUBLICATIONS

Translation of FR-2722054-A1 (Year: 2016).*
Extended European Search Report, European Application No. 20186153.1-1203, dated Dec. 4, 2020.

* cited by examiner

ELECTRONIC COMPONENT WITH COOLING CLEARANCE, AND ASSEMBLY METHOD

CROSS-REFERENCE TO RELATED APPLICATION

This application claims the benefit of the filing date under 35 U.S.C. § 119(a)-(d) of European Patent Application No. 20186153.1, filed on Jul. 16, 2020.

FIELD OF THE INVENTION

The present invention relates to an electronic component and, more particularly, to an electronic component having a heat generating electronic element.

BACKGROUND

Electronic components with electronic elements generating critical amounts of heat when in operation can, for instance, be found in the field of switching high currents and/or voltages, in particular in a vehicle. With the increase in heat dissipation from microelectronics devices and the reduction in overall form factors, thermal management becomes a more important element of electronic product design.

Both the performance reliability and life expectancy of electronic equipment are inversely related to the component temperature of the equipment. The relationship between the reliability and the operating temperature of a typical silicon semi-conductor device shows that a reduction in the temperature corresponds to an exponential increase in the reliability and life expectancy of the device. Therefore, long life and reliable performance of a component may be achieved by effectively controlling the device operating temperature within the limits set by the device design requirements.

Traditional electronic components having heat generating electronic elements (such as power switches) are usually equipped with heat sinks for handling the excessive heat. A heat sink is a passive heat exchanger that transfers the heat generated by an electronic or a mechanical device to a fluid medium, often air or a liquid coolant, where it is dissipated away from the device, thereby allowing regulation of the device's temperature. In the following, air is assumed to be the cooling fluid. In most situations, heat transfer across the interface between the solid surface and the coolant air is the least efficient within the system, and the solid-air interface represents the greatest barrier for heat dissipation. A heat sink lowers this barrier mainly by increasing the surface area that is in direct contact with the coolant. This allows more heat to be dissipated and/or lowers the device operating temperature. The primary purpose of a heat sink is to maintain the device temperature below the maximum allowable temperature.

Heat sinks are usually fabricated from a highly thermally conductive material, mainly metal. However, the assembly of a metal heat sink close to the heat generating electronic elements is time consuming, costly and requires a significant amount of extra installation space. Moreover, the total weight of the electronic component is substantially increased.

SUMMARY

An electronic component includes a circuit carrier unit and a housing at least partly encompassing the circuit carrier unit. The circuit carrier unit has an electronic element assembled on the circuit carrier unit. The circuit carrier unit has a first section and a second section arranged at a distance from the first section and opposing the first section. The housing has a first receiving portion receiving the first section and a second receiving portion receiving the second section. The first receiving portion and the second receiving portion are separated from each other by a cooling clearance.

BRIEF DESCRIPTION OF THE DRAWINGS

The invention will now be described by way of example with reference to the accompanying Figures, of which.

DETAILED DESCRIPTION OF THE EMBODIMENTS

The accompanying drawings are incorporated into the specification and form a part of the specification to illustrate several embodiments of the present invention. These drawings, together with the description, serve to explain the principles of the invention. The drawings are merely for the purpose of illustrating examples of how the invention can be made and used and are not to be construed as limiting the invention to only the illustrated and described embodiments. Furthermore, several aspects of the embodiments may form—individually or in different combinations—solutions according to the present invention. Further features and advantages will become apparent from the following more particular description of the various embodiments of the invention as illustrated in the accompanying drawings, in which like references refer to like elements. The present invention will now be explained in more detail with reference to the Figures.

Figure 1:
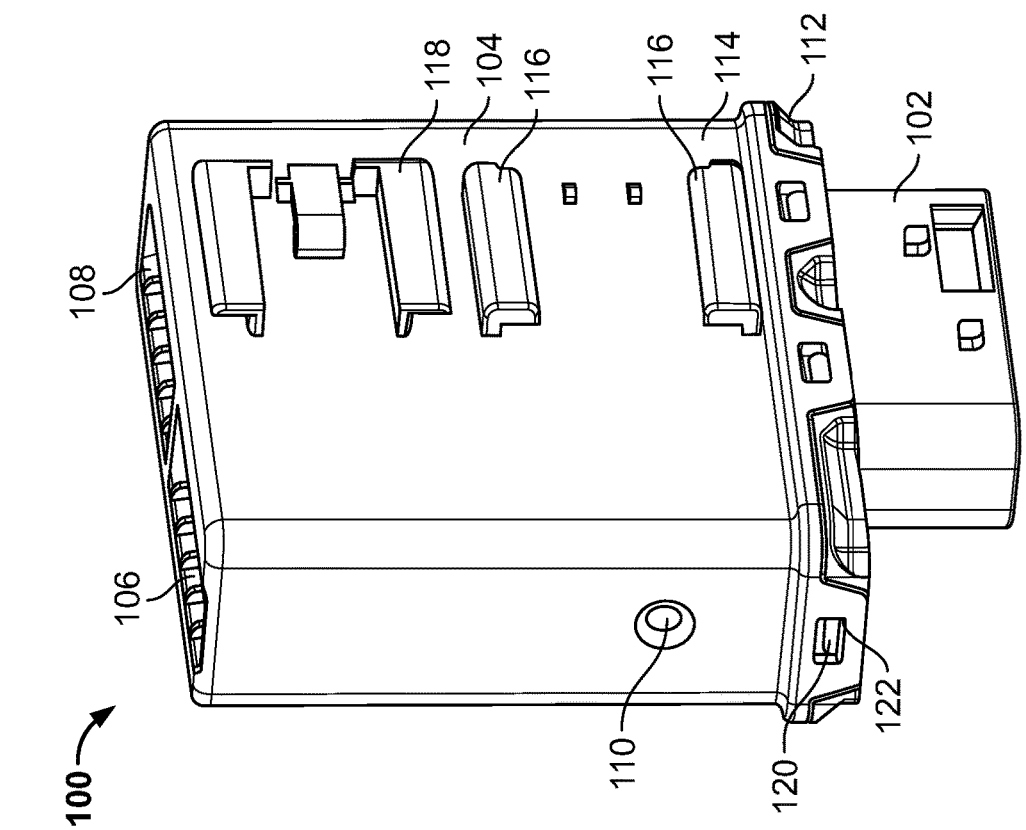
FIG. 1 is a perspective view of an electronic component according to an embodiment.

Referring to FIG. 1, a schematic perspective view of an electronic component 100 is shown for an electronic relay module. Although the following only describes the example of a solid state switching module having metal-oxide-semiconductor field-effect transistor (MOSFET) switches as the heat generating electronic components, it is clear that the principles of the present invention are of course also applicable for any other type of electronic element which needs efficient cooling in a restricted installation space.

As shown in FIG. 1, an electronic component 100 may for instance be a switching module which is connected via a connector interface element 102 to an external matching plug connector. The electronic component 100 comprises a housing 104 which is fabricated from an electrically insulating, but thermally conductive material. As will become apparent from the following drawings, the housing 104 encompasses as a circuit carrier unit. The housing 104 comprises a cooling chimney 106 which can also be referred to as a "cooling channel" or "cooling clearance". The cooling chimney 106 is formed as a blind cavity with an opening 108 on the upper side of FIG. 1 and a closed bottom region on the lower side of FIG. 1.

Close to the bottom area of the blind cavity, two venting apertures 110 are provided distanced apart from the opening 108. Thus, from the opening 108 towards the venting apertures 110, a flow channel is formed through which a cooling fluid, e. g. air or a cooling liquid, can move, thus dissipating the heat generated by the electronic elements inside the housing 104. This construction allows for an optimum thermal contact between the heat generating electronic elements and the cooling medium on the one hand, and a safe sealing of the complete circuitry to ensure protection against touch and ingress of solid particles and liquid.

Figure 2:
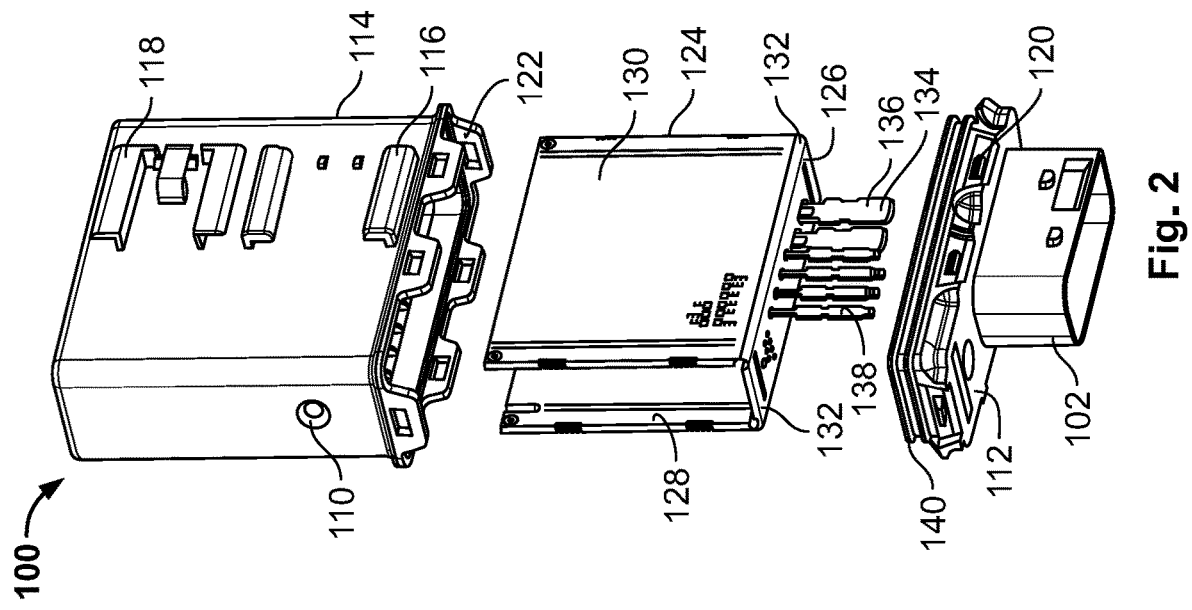
FIG. 2 is an exploded perspective view of the electronic component.

According to the example shown in FIGS. 1 and 2, the housing 104 comprises a base body 112 (sometimes also referred to as "header") and a cover element 114, which are sealingly connected to each other to enclose the circuit carrier unit and electronic elements in a watertight manner. The base body 112 and the cover element 114 are mechanically fixed at each other by a plurality of snap hooks 120 and snap fit recesses 122. However, the two parts can also be fitted together using ultrasonic or laser welding or gluing. Furthermore, it is clear that also more than two separately manufactured housing elements can be provided that are fit together to form the final enclosure of the housing 104. For instance, the cover element 114 may further be divided into two half-shells.

The cover element 114 can be fabricated from a cost-efficient plastic material. Around the circumference of the base body 112, sealing device 140 (for instance a sealing lip, integrally formed from the housing material and/or a silicone sealing lip) are provided to seal the interface between the base body 112 and the cover element 114.

In the embodiment of FIG. 1, the housing 104 as shown is provided with guides 116 and guiding clips 118 for attaching the electronic component to an external unit, e. g. the housing of a motor.

FIG. 2 shows the electronic component 100 of FIG. 1 in an exploded view. As can be seen in FIG. 2, the circuit carrier unit 124 has an essentially U-shaped cross-section with a base section 126, a first section 128, and a second section 130. The first and the second sections 128, 130 form first legs and second legs extending away from the base section 126.

In an embodiment, the circuit carrier unit 124 is a printed circuit board (PCB) and/or a flexible printed circuit (FPC) and/or a direct copper bonded (DCB) ceramic substrate, and/or a direct aluminum bonded (DAB) ceramic substrate. Printed circuit boards (PCB) can be fabricated from many different materials, depending on the required properties, such as electrical behavior or thermo-mechanical properties. In most cases, an electrically insulating material (e. g. epoxy with glass fiber) is combined with electrically conductive layers (e. g. copper), often in a multilayer structure. PCBs can be rigid or flexible. Flexible PCBs are in the following referred to as flexible printed circuits. For instance, flexible printed circuits (FPC) are made with a photolithographic technology. An alternative way of making flexible foil circuits or flexible flat cables (FFCs) is laminating very thin copper strips in between two layers of plastic material, such as PET.

DCB stands for Direct Copper Bonding and denotes a process in which copper and a ceramic material are fused together at high temperatures. For instance, two layers of copper are directly bonded to an aluminum oxide or aluminum nitride ceramic base. In particular, known power modules have been designed with DCB substrates. The DCB process yields a thin base and eliminates the need for thick, heavy copper bases that were used in the past. Because modules with DCB bases use fewer layers, they have much lower thermal resistance values and much better power cycling capabilities. DCB ceramic substrates have high mechanical strength and mechanical stability, good adhesion and corrosion resistance, excellent electrical insulation and thermal conductivity, as well as thermal cycling stability. Further, they have a matched thermal expansion coefficient to that of silicon (Si) and gallium arsenide (GaAs), or other semiconductor materials, and a good heat spreading.

The copper pattern providing the electrical interconnection is strong enough to handle high currents. The excellent thermal conductivity allows to place power semiconductor chips in very close proximity. This results in more power per unit of volume and improved reliability of a power system. Furthermore, there exist also so-called direct aluminum bonded substrates (DAB), which use aluminum instead of copper as the electrically conductive material. The lower weight and better thermal cycling performance of DAB make them ideal for automotive, aerospace, and other high reliability applications. Further, DCB/DAB is the basis for the "chip-on-board" technology which is the packaging trend for the next generation integrated power electronic components.

As shown in FIG. 2, flexible foil hinges 132 interconnect the first section 128 and the second section 130 with the base section 126. Thus, the circuit carrier unit 124 can be produced and assembled with the electronic elements thereon as a flat two-dimensional board and can be folded later to be inserted into the cover element 114 of the housing 104. Of course, the complete circuit carrier unit 124 may also be a flexible flat circuit board assembly, which is bent along suitable folding lines forming a hinge. The flexible hinge elements 132 may comprise foil hinges fabricated from a plastic material or a flexible foil cable (FFC). Of course, also other hinge techniques, such as multipart bearing hinges from every suitable material can also be used to hold together the sections of the circuit carrier unit 124.

The first section 128 may, for instance, be a power side, carrying high power MOSFETs which handle currents up to 20 A. The overall loss then amounts to around 2 W. The second section 130 is the signal and communication side in an embodiment. The base section 126 is provided with electrically conductive leads which are connected to electrically conductive contact elements 134. In particular, for carrying a higher electrical current, the wider flat-contacts 136 are provided as power contacts, whereas the smaller flat-contacts 138 are provided as signal contacts. The contact elements 134 allow the connection to external components, such as an electrical connector proving power lines and signal lines in case of an electronic relay. The contact elements 134 of the connector interface 102 are electrically connected to electronic elements 146. This allows the connector interface 102 to be part of a plug connector and to be contacted by a mating connector element.

In an embodiment, the electrically conductive contact elements 134 are press-fit pins which are connected to the circuit carrier unit 124 via a press-fit connection. However, also a solder or welded connection can be employed. The conductive contact elements 134 may either have the shape of pin contacts or tab (flat-) contacts which can be inserted into matching contact receptacles, or they may be formed as contact receptacles or fork contacts for receiving matching pin or tab contacts.

Figure 4:
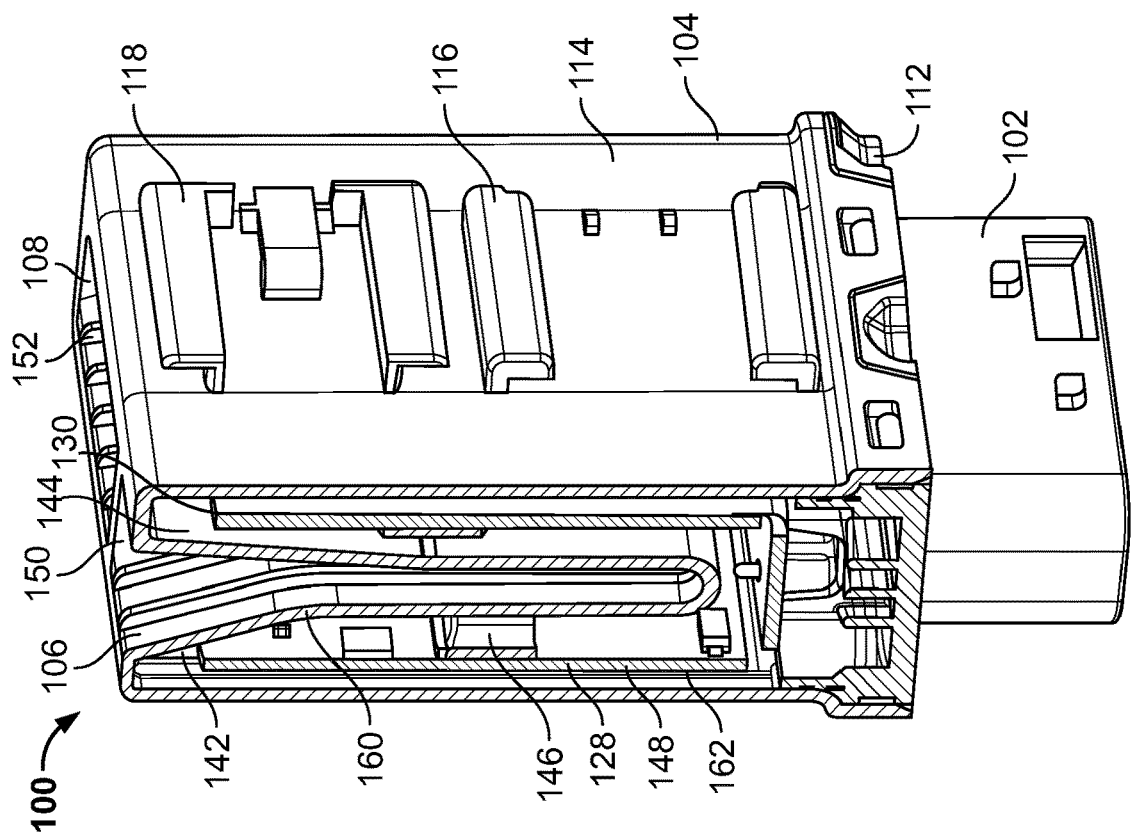
FIG. 4 is another sectional perspective view of the electronic component.

The first section 128 of the circuit carrier unit 124 is populated with the heat generating electronic elements, specifically the power switches or semiconductor switches (e.g. MOSFETs or IGBTs). Opposite to the first section 128, the second section 130 carries the electronic elements which produce less heat, but are sensitive towards heat, namely the signal processing circuitry. As shown in FIG. 4, each section 128, 130 is held in a separate compartment of the housing 104, both compartments separated from each other by the cooling chimney 106. By dividing the circuit board or circuit carrier unit 124 into two areas, one being a power side and the other being a signal side, an improved heat dissipation and additionally a touch protection can be achieved. Further, heat generated by the switching losses of the semiconductor switches does not affect the signal processing components.

As shown in FIG. 4, the first section 128 and the second section 130 are received in respective first and second receiving portions 142, 144 that form separate inner compartments of the housing 104. The electronic elements 146 are assembled on a substrate 148 in a manner that at least the elements radiating the highest amount of heat are oriented towards the cooling clearance 106. The first and second receiving portions 142, 144 are formed by two parallel slots. The first and second sections 128, 130 can thus be slid into the belonging first and the second receiving portions 142, 144 in one simultaneous step.

Figure 3:
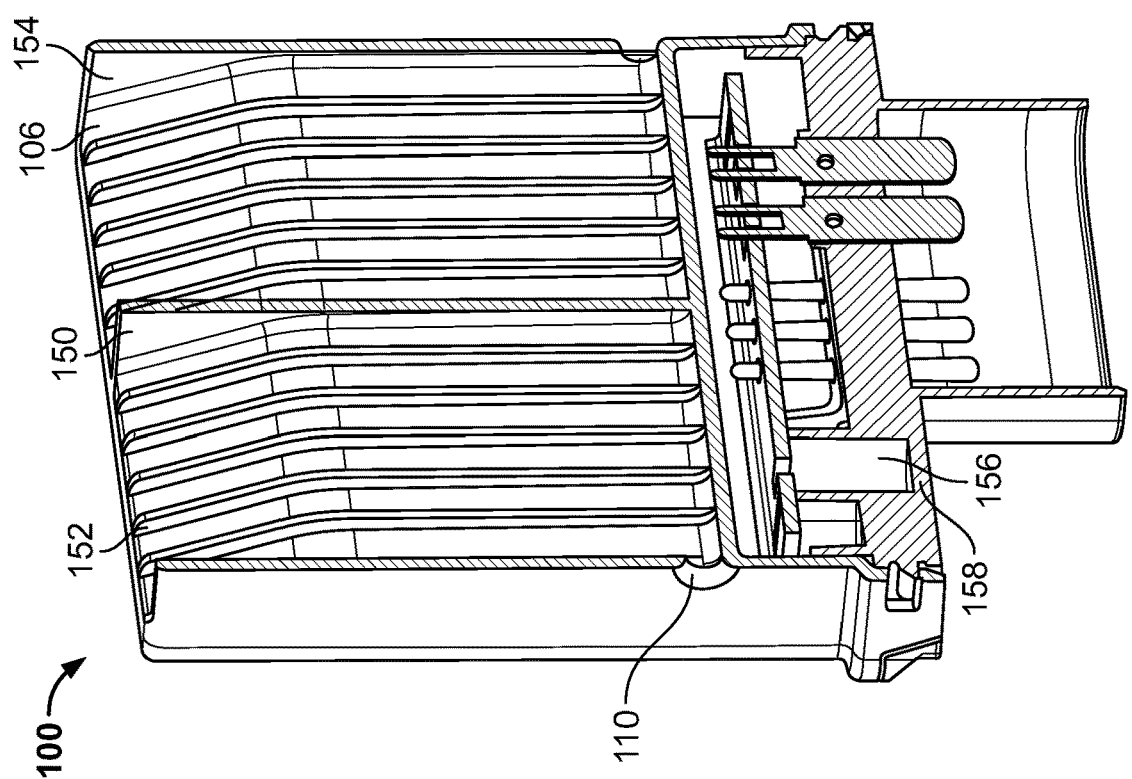
FIG. 3 is a sectional perspective view of the electronic component.

The cooling clearance 106, as shown in FIGS. 3 and 4, is designed as two blind cavities separated by a separation wall 150. In various embodiment, the separation wall 150 is optional. The cooling clearance 106 has a plurality of cooling ribs (or fins) 152 for enlarging the surface that comes into contact with the cooling fluid, e. g. air. The cooling ribs 152 may have any suitable cross-section, for instance a V-shaped tapered cross-section. Moreover, the cooling ribs 152 may be provided in an arbitrary number on the inside and/or the outside of one or both of the walls 160 of the cooling chimney 106, which oppose the circuit carrier unit 124. The cooling ribs 152 extend along the blind cavity from the opening toward the bottom region of the blind cavity.

As shown in FIGS. 3 and 4, the cooling chimney 106 has a funnel shaped peripheral area 154 for forming an enlarged opening 108 that facilitates the heated air to escape from the cooling chimney 106. On the other hand, the cooling chimney 106 has dimensions that are small enough to inhibit the access of a larger object (such as a finger). Thus, an effective touch protection can be achieved because the hot area is not accessible for the user.

For intaking cooler air, the venting apertures 110 shown in FIG. 3 are provided at the bottom of the blind cavity forming the cooling chimney 106. When in operation, heat is generated by the electronic elements 146 and the air inside cooling clearance 106 is heated up. Due to natural convection in the chimney, that warm air flows towards the upper end of the cooling clearance 106. At the same time cool air is drawn into the venting apertures 110, so that a steady flow of cooling medium dissipates the heat. Of course, also a forced flow of the cooling medium by a ventilator or a pump can be used for cooling the electronic component 100. In particular with a venting aperture 110, the ribs 152 lead to a more or less laminar cooling fluid flow, thereby improving the heat dissipation.

As mentioned above, the cooling medium does not have to be gaseous, like air, but can also be a liquid, like the cooling liquid used in a vehicle.

Optionally, the inner volume of the housing 104 may also be at least partly filled with a potting material. Such a potting material is filled in as a fluid precursor material and is cured to reach a hardened state. For filling in the fluid precursor material, the base body 112 has a filling aperture 156 shown in FIG. 3, which is opened by removing the web 158 (forming a closing cap), and which can be covered by a sealing plug or blind plug after the potting material has been filled in and has hardened to its final consistency. The potting material improves the cooling effect and, furthermore, mechanically stabilizes the circuit carrier unit 124 inside the housing 104 against vibrations.

Furthermore, an additional layer of thermal interface material (TIM) 162 can be arranged between the circuit carrier unit 124 and housing 104 on one or both surfaces of the circuit carrier 124, as shown in FIG. 4. Moreover, guiding ribs may be arranged at the inside of the first and/or second receiving portions 142, 144 in order to facilitate mounting the circuit carrier unit 124 and to secure it inside the housing 104.

The present disclosure provides an electronic component 100 which allows an efficient heat management even in constricted spaces, the exterior volume and outer dimensions of the package being maintained. The ingress protection sealing is not impaired by the improvement in heat dissipation. A heat-developing circuit board in a plastic cover can be cooled effectively by separating the circuit board into at least two areas 128, 130, a power side and a signal side. Touch protection can be achieved on the hot side for a user without significantly increasing the outer dimensions of the electronic component 100.

Instead of the conventional cover that does not provide sufficient surface area for heat dissipation, the present disclosure proposes a cover 114 that is divided into two regions by introducing a chimney 106 through which the surface area is increased and additional ventilation is provided by air circulation through side vents 110. These vents may also serve as drainage holes for letting out liquids, such as condensed water. The chimney 106 allows the internally generated heat to be dissipated quickly and efficiently to the outside and the user is protected from touching the hot surface. The electronic component 100 can be fabricated economically.

What is claimed is:

1. An electronic component, comprising:
 a circuit carrier unit having an electronic element assembled on the circuit carrier unit, the circuit carrier unit has a first section and a second section; and
 a housing at least partly encompassing the circuit carrier unit, the housing has a first receiving portion receiving the first section and a second receiving portion receiving the second section, the first receiving portion and the second receiving portion are connected by at least one side wall and separated from each other by a cooling clearance having a closed proximal end near the electronic component and a distal end open to an external environment and the housing also having at least one venting aperture in the side wall placed near the closed proximal end of the cooling clearance configured to communicate between the cooling clearance and the external environment, the cooling clearance and the venting aperture being part of a cover element of the housing configured to enclose and seal the circuit carrier unit and electronic element in a watertight manner.

2. The electronic component of claim 1, wherein the circuit carrier unit has a base section connecting the first section and the second section.

3. The electronic component of claim 2, wherein the circuit carrier unit has a flexible hinge element connecting the base section to the first section and/or the second section.

4. The electronic component of claim 2, wherein the circuit carrier unit has a U-shaped cross-section, the first section forms a first leg and the second section forms a second leg extending from the base section.

5. The electronic component of claim 4, wherein the first receiving portion and the second receiving portion are formed by a pair of parallel slots.

6. The electronic component of claim 1, wherein the circuit carrier unit is at least one of a printed circuit board, a flexible printed circuit, a direct copper bonded ceramic substrate, and a direct aluminum bonded ceramic substrate.

7. The electronic component of claim 1, wherein the cooling clearance formed by a cavity with a closed bottom region and the venting aperture admits a cooling medium other than air though the housing.

8. The electronic component of claim 1, wherein the venting aperture creates a laminar flow in the cooling clearance that flows in a direction from the electronic element toward the proximal end.

9. The electronic component of claim 7, further comprising a plurality of cooling ribs extending along the cavity from the opening toward the closed bottom region.

10. The electronic component of claim 1, further comprising a connector interface electrically contacting the electronic element.

11. The electronic component of claim 10, wherein the connector interface has a plurality of electrically conductive contact elements.

12. The electronic component of claim 11, wherein the electrically conductive contact elements are a plurality of press-fit pins connected to the circuit carrier unit.

13. The electronic component of claim 1, wherein the electronic element is a power switching element.

14. The electronic component of claim 1, wherein the housing is at least partly filled with a potting material that covers at least a part of the circuit carrier unit.

15. A method for assembling an electronic component, comprising:
providing a circuit carrier unit, an electronic element is assembled on the circuit carrier unit, the circuit carrier unit has a first section and a second section arranged at a distance from the first section and opposing the first section;
providing a housing having a bottom, a first receiving portion and a second receiving portion separated from the first receiving portion wherein the housing defines a cover comprising both a cooling clearance having a closed end and an open end, and a side wall having at least one venting aperture through the side wall and in fluid communication with the cooling clearance and adjacent to the bottom;
inserting the circuit carrier unit at least partly into the housing, the first section is received in the first receiving portion and the second section is received in the second receiving portion, and the electronic component is adjacent to the bottom; and
affixing the cover element to enclose and seal the circuit carrier unit and electronic element in a watertight manner.

16. The method of claim 15, wherein the first section and the second section are inserted simultaneously into the first receiving portion and the second receiving portion.

17. An electronic component, comprising:
a circuit carrier unit having an electronic element; and
a housing having a housing wall at least partly encompassing the circuit carrier unit, the housing having:
a first receiving portion and a second receiving portion connected by a side wall and separated from each other by a cooling clearance extending from a proximal end adjacent the electronic element, toward a distal end open to an external environment thereby defining a heat dissipation axis, and
at least one venting aperture extending through the side wall placed near the electronic element and away from the distal end, and configured to communicate between the cooling clearance and the external environment.

18. The electronic component of claim 17, wherein the cooling clearance and the venting aperture for part of a cover element of the housing configured to enclose and seal the circuit carrier unit and electronic element in a watertight manner.

19. The electronic component of claim 18, wherein the circuit carrier has a U-shaped cross-section and has a first area and second area each area having an inner surface and an outer surface, and the housing wall covers both the inner surface of the first area and the inner surface of the second area to define the cooling clearance, and wherein the aperture penetrates the housing and is configured to provide fluid communication through the side wall from the external environment to the cooling clearance in an area adjacent the electronic element, wherein the first and second area are sealed,
whereby cooling fluid flows from the aperture and carries heat away from the electronic element through the cooling clearance.

* * * * *